United States Patent
Lin et al.

(10) Patent No.: US 10,056,350 B2
(45) Date of Patent: Aug. 21, 2018

(54) FAN-OUT PACKAGE STRUCTURE, AND MANUFACTURING METHOD THEREOF

(71) Applicant: SJ SEMICONDUCTOR (JIANGYIN) CORPORATION, JiangYin (CN)

(72) Inventors: Chengchung Lin, JiangYin (CN); Qifeng Cai, JiangYin (CN)

(73) Assignee: SJ Semiconductor (Jiangyin) Corporation, JiangYin (CN)

(*) Notice: Subject to any disclaimer, the term of this patent is extended or adjusted under 35 U.S.C. 154(b) by 0 days.

(21) Appl. No.: 15/571,581

(22) PCT Filed: Mar. 14, 2016

(86) PCT No.: PCT/CN2016/076236
§ 371 (c)(1),
(2) Date: Nov. 3, 2017

(87) PCT Pub. No.: WO2017/075929
PCT Pub. Date: May 11, 2017

(65) Prior Publication Data
US 2018/0158798 A1    Jun. 7, 2018

(30) Foreign Application Priority Data

Nov. 3, 2015  (CN) .......................... 2015 1 0741725

(51) Int. Cl.
*H01L 21/48* (2006.01)
*H01L 21/56* (2006.01)
(Continued)

(52) U.S. Cl.
CPC .............. *H01L 24/97* (2013.01); *H01L 21/48* (2013.01); *H01L 21/56* (2013.01); *H01L 23/488* (2013.01);
(Continued)

(58) Field of Classification Search
CPC .......... H01L 24/97; H01L 21/56; H01L 24/81; H01L 24/11; H01L 23/488; H01L 21/48;
(Continued)

(56) References Cited

U.S. PATENT DOCUMENTS

| 2013/0105966 A1* | 5/2013 | Kelkar .................... H01L 24/19 257/737 |
| 2013/0168849 A1* | 7/2013 | Scanlan .................. H01L 21/78 257/737 |

FOREIGN PATENT DOCUMENTS

| CN | 103077933 A | 5/2013 |
| CN | 103187322 A | 7/2013 |
| CN | 105225965 A | 1/2016 |

* cited by examiner

*Primary Examiner* — Caleen Sullivan
(74) *Attorney, Agent, or Firm* — Alston & Bird LLP

(57) ABSTRACT

The method of fabricating a fan-out package structure comprises: S1, providing a substrate (1), forming an adhesive layer (2) on the substrate's upper surface; S2, forming a redistribution layer (3) on the adhesive layer's upper surface; S3, bonding one first chip (4) to the redistribution layer's upper surface, and constructing at least two first bump structures (5), wherein the first chip and the first bump structures are all electrically connected to the redistribution layer, and top portions of the first bump structures are taller than a top portion of the first chip; S4, forming a plastic encapsulation layer (6) on the upper surface of the redistribution layer, wherein the plastic encapsulation layer embeds the first chip and exposes upper ends of the first bump structures; and S5, removing the substrate and the adhesive layer, and constructing a second bump structure (7) on a lower surface of the redistribution layer.

17 Claims, 5 Drawing Sheets

(51) Int. Cl.
   *H01L 23/488* (2006.01)
   *H01L 23/00* (2006.01)
(52) U.S. Cl.
   CPC .............. *H01L 24/11* (2013.01); *H01L 24/81*
   (2013.01); *H01L 2224/02379* (2013.01); *H01L 2224/04105* (2013.01); *H01L 2224/11* (2013.01); *H01L 2224/12105* (2013.01); *H01L 2224/16225* (2013.01); *H01L 2224/48091* (2013.01); *H01L 2224/81801* (2013.01); *H01L 2924/181* (2013.01)
(58) Field of Classification Search
   CPC . H01L 2224/81801; H01L 2224/04105; H01L 2224/12105; H01L 2224/02379; H01L 2224/11; H01L 2924/181; H01L 2224/16225; H01L 2224/48091
   USPC .......................................................... 438/106
   See application file for complete search history.

FAN-OUT PACKAGE STRUCTURE, AND MANUFACTURING METHOD THEREOF

CROSS REFERENCES

This application is a national phase entry of International Application No. PCT/CN2016/076236, entitled "Fan-out Package Structure, and Manufacturing Method thereof', filed with WIPO on Mar. 14, 2016, which claims priority to Chinese Patent Application No. CN201510741725.0, entitled "Fan-out Package Structure, and Manufacturing Method thereof', filed with the Chinese Patent Office on Nov. 3, 2015 the contents of which are incorporated herein by reference in its entirety.

TECHNICAL FIELD

The present application relates to the field of semiconductor package and more specifically, relates to a fan-out package structure and a manufacturing method of the fan-out package structure.

BACKGROUND

The semiconductor industry continuously improves the integrated density of various electronic components by sustainably decreasing the minimum characteristic size, such that more electronic components can be integrated under the situation of a given area. At present, the most advanced package solutions include a wafer level chip-scale package, a fan-out wafer level package, a flip chip and a package on package (POP), etc.

The traditional fan-out wafer level package (FOWLP) generally comprises the following several steps: firstly cutting off a single micro-chip from a wafer, and bonding the chip with the front surface facing downwards to an adhesive layer of a carrier by adopting a standard picking and placing device; then forming a plastic encapsulation layer and embedding the chip into the plastic encapsulation layer; and after the plastic encapsulation layer is solidified, removing the carrier and the adhesive layer, then performing a redistribution layer process and a reballing process; and finally performing cutting and testing. A redistribution layer (RDL) is an interface between a chip and a package in a flip chip module. A redistribution layer is an additional metal layer, consists of core metal top wiring and is used for outwards binding an I/O pad of a die to other positions such as a bump pad, etc. Bumps are usually arranged in a grid pattern, each bump is cast with two pads (one is located at the top and the other is located at the bottom), which are respectively connected with the redistribution layer and a package substrate. The traditional fan-out wafer level package easily causes an offset between the chip and the RDL, thereby resulting in low yield.

The package on package (POP) may allow a plurality of chips to be vertically stacked in a single package, vertically separated logic chip and memory chip ball arrays are integrated, stacked packages transmit signals through the standard IO interfaces, resulting in multiple folds of component density, and increased functions of a single package, therefore POP is widely applied to fields of mobile phones, personal digital assistants (PDA) and digital cameras, etc.

In advanced packaging, through-silicon via (TSV) technology has a great significance. It is a vertical electric connection technology for penetrating through a substrate (especially a silicon substrate). The TSV technology may replace nearly all wire bonding packaging and thus improve electrical performances of all types of chip packages, including integration level and chip size reduction, especially in advanced packaging such as system-in-package (SiP), wafer-level package (WLP) and 3D packaging. Fabrication of TSV includes fabrication of vias, deposition of insulating layers, filling of vias, and subsequent processes such as chemical mechanical planarization (CMP) process and redistribution (RDL) process, etc. The traditional POP is related to =TSV technology, there are a series of complex fabrication processes needed, consequently causing higher production costs and lower yield.

Therefore, it has become an important and urgent technical problem to be solved how to provide a fan-out package structure and a manufacturing method thereof to reduce the production cost and improve the yield.

SUMMARY

The present application provides a fan-out package structure and a manufacturing method of the fan-out package structure. The method comprises the following steps:

S1: providing a substrate and forming an adhesive layer on an upper surface of the substrate;

S2: forming a redistribution layer on an upper surface of the adhesive layer;

S3: bonding at least one first chip to an upper surface of the redistribution layer and fabricating at least two first bump structures thereon, wherein the first chip and the first bump structures are all electrically connected with the redistribution layer, and top portions of the first bump structures are higher than a top portion of the first chip;

S4: forming a plastic encapsulation layer on the upper surface of the redistribution layer, wherein the plastic encapsulation layer covers the first chip and exposes upper ends of the first bump structures; and S5: removing the substrate and the adhesive layer, and fabricating a second bump structure on a lower surface of the redistribution layer.

Alternatively, the method further comprises a step S6: bonding at least one first package to the exposed upper ends of the first bump structures.

Alternatively, the structure obtained in the step S6 is connected to a second package through the second bump structure.

Alternatively, the redistribution layer comprises a dielectric layer and at least one layer of redistribution metal line formed in the dielectric layer.

Alternatively, in the step S3, a third bump structure is fabricated on a surface of the first chip and the first chip is electrically connected with the redistribution layer through the third bump structure.

Alternatively, in the step S3, each of the first bump structures comprises a metal post and a tin-based metal cap formed at a top end of the metal post.

Alternatively, the metal post is a Cu post or a Ni post.

Alternatively, in the step S3, the first bump structures are metal solder balls.

Alternatively, in the step S4, a press molding process is adopted for forming the plastic encapsulation layer and comprises the following steps:

S4-1: providing a press molding assembly comprising a bottom pressing block and a top pressing block;

S4-2: sticking an isolating film to a lower surface of the top pressing block, placing the substrate on a surface of the bottom pressing block and placing a plastic encapsulation material on a surface of the redistribution layer;

S4-3: clamping the substrate through the top pressing block and the bottom pressing block to flatten the plastic encapsulation material, and embedding the upper ends of the first bump structures into the isolating film; and S4-4: releasing the top pressing block and the bottom pressing block, and stripping off the isolating film.

Alternatively, the isolating film is made of a flexible polymer material.

Alternatively, in the step S5, the second bump structure is a metal solder ball.

The present disclosure further provides a fan-out package structure, comprising:

a redistribution layer;

at least one first chip bonded to an upper surface of the redistribution layer and electrically connected with the redistribution layer;

at least two bump structures electrically connected with the redistribution layer and having top portions higher than a top portion of the first chip;

a plastic encapsulation layer covering the first chip and exposing upper ends of the first bump structures; and a second bump structure fabricated on a lower surface of the redistribution layer.

Alternatively, the fan-out package structure further comprises at least one first package bonded to the exposed upper ends of the first bump structures.

Alternatively, the fan-out package structure further comprises a second package connected with the second bump structure.

Alternatively, the redistribution layer comprises a dielectric layer and at least one layer of redistribution metal line formed in the dielectric layer.

Alternatively, a third bump structure is fabricated on a surface of the first chip and the first chip is electrically connected with the redistribution layer through the third bump structure.

Alternatively, each of the first bump structure comprises a metal post and a tin-based metal cap formed at a top end of the metal post; or the first bump structures are metal solder balls.

As described above, the fan-out package structure and the manufacturing method thereof provided by the present application have the following benefits: (1) in the manufacturing method of the fan-out package structure provided by the present application, the redistribution layer is fabricated on the carrier before the chip is connected with the redistribution layer, the offset problem from misalignment between the chip and the redistribution layer due to shrinkage of the plastic encapsulation material during heating and the solidification in the traditional plastic encapsulation process is prevented, and the yield is greatly improved. (2) The present application may allow bonding at least one first package to the exposed upper ends of the first bump structures, to obtain a package-on-package (PoP) structure; the plurality of first packages may have various types, widening the applications. (3) The present application adopts the first bump structures as the interconnection structures of the package-on-package, and embeds the first bump structures into the plastic encapsulation layer, meanwhile exposes the upper ends of the first bump structures. Comparing to the complicated TSV fabrication process, the present application discloses a simpler process flow where the first bump structures are fabricated before forming the plastic encapsulation layer by press molding, and the upper package can be directly bonded to the exposed upper portions of the first bump structures, thereby the packaging procedure is also simpler plus the cost is reduced. (4) The present application allows getting the plastic encapsulation layer from press molding process along with an isolating film. As a result, the upper surface of the plastic encapsulation layer is lower than the top portions of the first bump structures, avoiding a plastic thinning process and a laser drilling process. This new technique not only saves materials and reduces pollution, it also avoids damages to circuit structures in the plastic thinning process, and facilitates package-on-package manufacturing. (5) the fan-out package structure disclosed by the present application not only enables a package-on-package structure, also provides a multiple package bonding capability for multiple application demands. Simultaneously the resultant final package-on-package structure is able to bond to a PCB or other packages through the second bump structures.

DESCRIPTION OF COMPONENT REFERENCE NUMERALS

Figure 1:
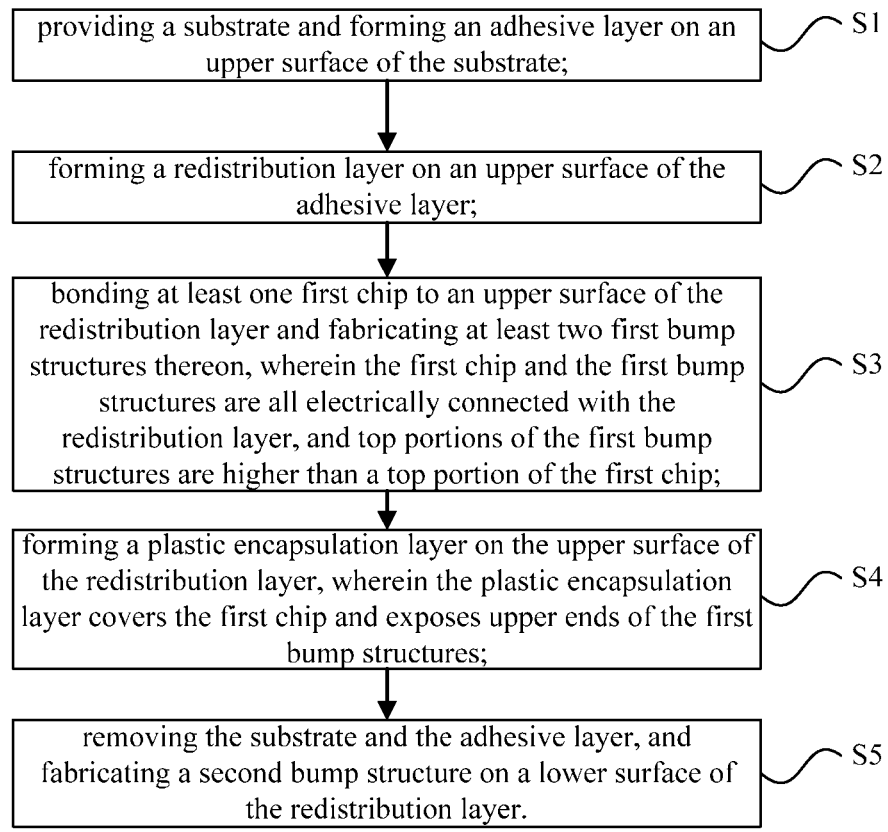
FIG. 1 illustrates a process flowchart of a manufacturing method of a fan-out package structure according to the present disclosure.

S1-S5 Steps 1-5
1 Substrate
2 Adhesive layer
3 Redistribution layer
31 Dielectric layer
32 Redistribution metal line
4 First chip
41 Third bump structure
5 First bump structure
51 Metal post
52 Tin-based metal cap
6 Plastic encapsulation layer
7 Second bump structure
8 First package
9 Second package
10 Press molding assembly
101 Bottom pressing block
102 Top pressing block
11 Isolating film
12 Plastic encapsulation material

DETAILED DESCRIPTION OF THE PREFERRED EMBODIMENTS

The implementation embodiments of the present disclosure will be described below through specific examples. One skilled in the art can easily understand other advantages and effects of the present invention according to contents disclosed in the description. The present invention may also be implemented or applied through other different specific implementation modes. Various modifications or variations may be made to all details in the description based on different points of view and applications without departing from the spirit of the present application.

Please refer to FIG. 1 to FIG. 14. It needs to be stated that the drawings provided in the embodiments are just used for schematically describing the basic concept of the present disclosure, thus only illustrate components related to the present disclosure and they are not drawn according to the numbers, shapes and sizes of components during actual implementation, the configuration, number and scale of each component during actual implementation thereof may be freely changed, and the component layout configuration thereof may be more complicated.

Embodiment 1

The present disclosure provides a fan-out package structure and a manufacturing method making it. Please refer to FIG. 1 which illustrates a process flowchart of the method. The method comprises the following steps:

S1: providing a substrate and forming an adhesive layer on an upper surface of the substrate;

S2: forming a redistribution layer on an upper surface of the adhesive layer;

S3: bonding at least one first chip to an upper surface of the redistribution layer and fabricating at least two first bump structures thereon, wherein the first chip and the first bump structures are all electrically connected with the redistribution layer, and top portions of the first bump structures are higher than a top portion of the first chip;

S4: forming a plastic encapsulation layer on the upper surface of the redistribution layer, wherein the plastic encapsulation layer covers the first chip and exposes upper ends of the first bump structures; and S5: removing the substrate and the adhesive layer, and fabricating a second bump structure on a lower surface of the redistribution layer.

Figure 2:
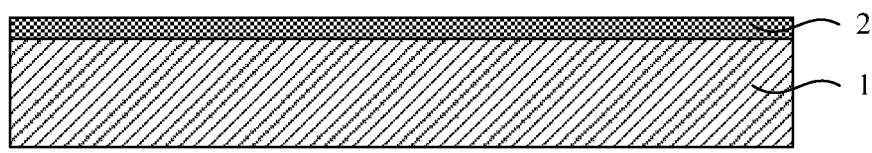
FIG. 2 illustrates a schematic cross sectional view of an adhesive layer on an upper surface of a substrate of the fan-out package structure according to the present disclosure.

First refer to FIG. 2. Perform step S1: providing a substrate 1 and forming an adhesive layer 2 on an upper surface of the substrate 1.

The substrate 1 may provide a rigid structure or a base body for subsequently fabricating an adhesive layer 2, a redistribution layer 3, a plastic encapsulation layer 6, etc., and a material of the substrate 1 may be selected from at least one of glass, metal, semiconductor (such as Si), polymer and ceramic. As an example, the material of the substrate 1 is glass. In the present invention, the substrate may be of a wafer shape, square shape (e.g., 500×500 mm) or any other shapes as needed.

The adhesive layer 2 is used as a separation layer between the redistribution layer 3 and the substrate 1 in the subsequent process. The adhesive layer 2 is optimally made of an adhesive material having a smooth and clean surface, and it should have a certain binding force with the redistribution layer 3 to guarantee that the redistribution layer 3 does not move in a subsequent process or the like, and in addition, the adhesive layer 2 should have a relative strong binding force with the substrate 1. Generally, the adhesive layer 2 has a greater binding force with the substrate 1 than that with the redistribution layer 3. As an example, a material of the adhesive layer 2 is an adhesive tape having adhesiveness on both sides, and an adhesive manufactured through a spin-coating process, or the like. The adhesive tape is preferably a UV adhesive tape which can be very easily torn off after UV light illumination. In other embodiments, the adhesive layer 2 may be selected from other material layers prepared by a physical vapor deposition method or a chemical vapor deposition method, such as epoxy, silicone rubber, polyimide (PI), polybenzoxazole (PBO) and benzocyclobutene (BCB) and the like. When separating the substrate 1 in the subsequent process, it may remove the adhesive layer 2 by adopting methods such as a wet etching method or a chemical mechanical polishing method.

Figure 3:
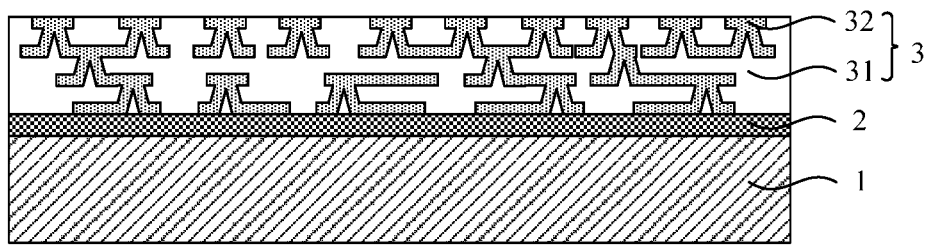
FIG. 3 illustrates a schematic cross sectional view of a redistribution layer on an upper surface of the adhesive layer of the fan-out package structure according to the present invention.

Referring to FIG. 3, and step S2 is performed: forming a redistribution layer 3 on an upper surface of the adhesive layer 2.

Specifically, the redistribution layer 3 comprises a dielectric layer 31 and at least one layer of redistribution metal line 32 formed in the dielectric layer 31. As an example, as illustrated in FIG. 3, the redistribution layer 3 comprises four layers of redistribution metal lines 32, wherein the redistribution metal lines 32 in a top layer and a bottom layer are respectively exposed at an upper surface and a bottom surface of the dielectric layer 31. All layers of redistribution metal lines 32 are interconnected through a plurality of conducting posts.

As an example, in the case that the redistribution layer 3 comprises a plurality of layers of redistribution metal lines 32, the layers of redistribution metal lines 32 may be obtained by alternately depositing the dielectric layers and the redistribution metal line layers in sequence. The redistribution metal lines 32 may be formed by a physical vapor deposition (PVD) method, chemical vapor deposition (CVD) method, sputtering method, an electric plating method or chemical plating method. The dielectric layer 31 may be formed by spin-coating method, physical vapor deposition method or chemical vapor deposition method.

The redistribution metal lines 32 adopt a conductive metal including but not limited to a good conductor such as copper, aluminum and titanium. The material of the dielectric layer 31 includes but not limited to epoxy resin, silicone rubber, silicon resin, PI, PBO, and BCB, and may also include low-K dielectrics such as silicon oxide, phosphor silicate glass and fluoride glass and the like.

Figure 4:
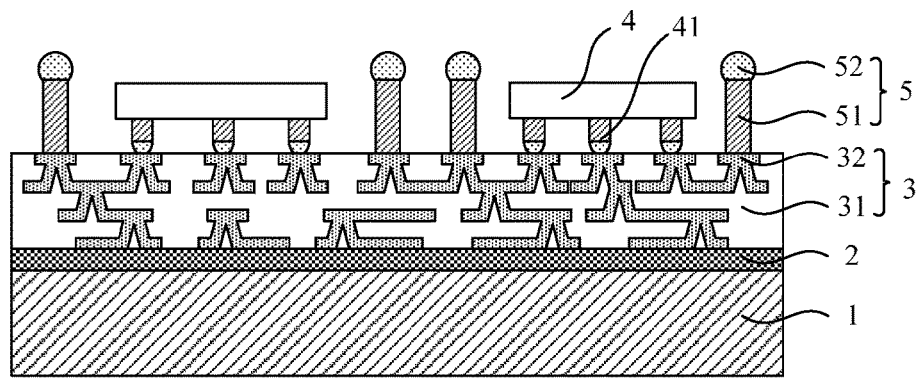
FIG. 4 illustrates a schematic cross sectional view of a first chip on an upper surface of the redistribution layer and two first bump structures of the fan-out package structure according to the present disclosure.

Referring to FIG. 4 after step S3 is performed: at least one first chip 4 is bonded to the upper surface of the redistribution layer 3 and at least two first bump structures 5 are fabricated, wherein the first chip 4 and the first bump structures 5 are all electrically connected with the redistribution layer 3, and top portions of the first bump structures 5 are higher than the top portion of the first chip 4.

Specifically, the first chip 4 may be bonded to the upper surface of the redistribution layer 3 through a bond-on-trace method. As an example, a third bump structure 41 is fabricated on a surface of the first chip 4, and the first chip 4 is electrically connected with the redistribution layer 3 through the third bump structure 41. The third bump structure 41 includes but not limited to a copper, nickel or silver-tin-copper alloy solder ball.

The first chip 4 may include a substrate or more circuit structures. When a plurality of first chips 4 are bonded to the upper surface of the redistribution layer 3, the first chips 4 may be of the same type and may also be of various types.

In the manufacturing method of the fan-out package structure of the present disclosure, the redistribution layer is fabricated on the carrier, before the chip is connected with the redistribution layer, thereby the method avoids the problem of misalignment between the chip and the redistribution layer from the shrinkage of the plastic encapsulation material during heating or solidification in the traditional plastic encapsulation process, and the yield is greatly improved.

Specifically, the top portions of the first bump structures 5 are made higher than the top portion of the first chip 4. When there are many first chips 4 with different heights, the top portions of the first bump structures 5 are higher than the top portions of all first chips 4.

In this embodiment, each of the first bump structures 5 comprises a metal post 51 and a tin-based metal cap 52 formed at the top end of the metal post 51. The metal post 51 is made of materials including but not limited to Cu or Ni. The metal post 51 may be formed through processes such as a conventional thick-photoresist photo-etching process, a development process and a metal deposition process and the like, and the metal post 51 may also be formed through processes such as a micro-imprinting and metal deposition and the like.

In another embodiment, the first bump structures 5 may have no metal posts, but have just metal solder balls. The metal solder balls solution for first bump structures 5 compared to combining metal posts with tin-based metal caps is more beneficial for saving packaging area.

Figure 5:
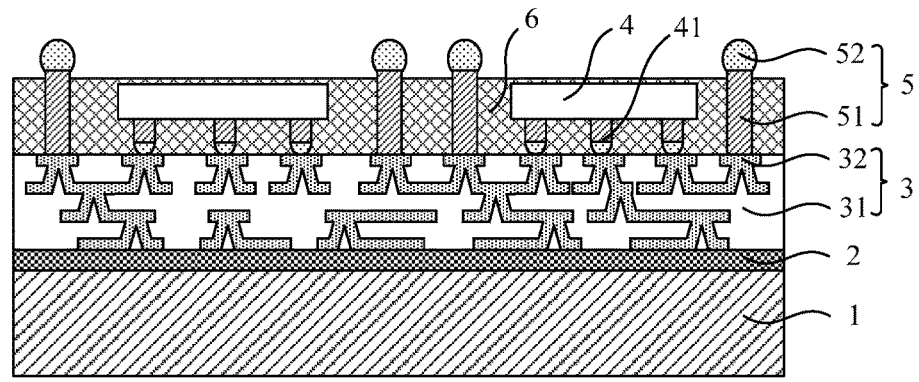
FIG. 5 illustrates a schematic cross sectional view of a plastic encapsulation layer on the upper surface of the redistribution layer in the fan-out package structure according to the present disclosure.

Referring to FIG. 5 as step S4 is performed: a plastic encapsulation layer 6 formed on the upper surface of the redistribution layer 3, wherein the plastic encapsulation layer 6 covers the first chip 4 and expose supper portions of the first bump structures 5, for example the tin-based metal cap 52.

Specifically, the plastic encapsulation layer 6 adopts a thermosetting material, including but not limited to one or more of a polymer material, a resin-based material, polyimide (PI) and epoxy resin.

Figure 6:
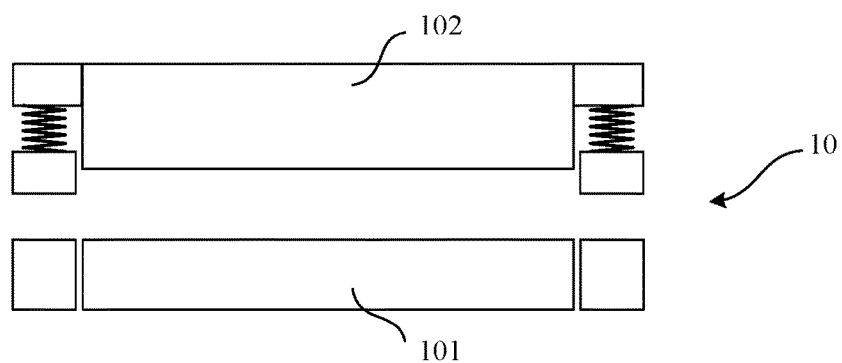
FIG. 6 illustrates a structural schematic view of a press molding assembly used in the manufacturing method of the fan-out package structure according to the present disclosure.

Specifically, the heights of the exposed upper ends of the first bump structures 5 may be adjusted as needed. In this embodiment, a press molding process forms the plastic encapsulation layer 6 and comprises the following steps:

As illustrated in FIG. 6, when S4-1 is perform: providing a press molding assembly 10, wherein the press molding assembly 10 comprises a bottom pressing block 101 and a top pressing block 102.

Figure 7:
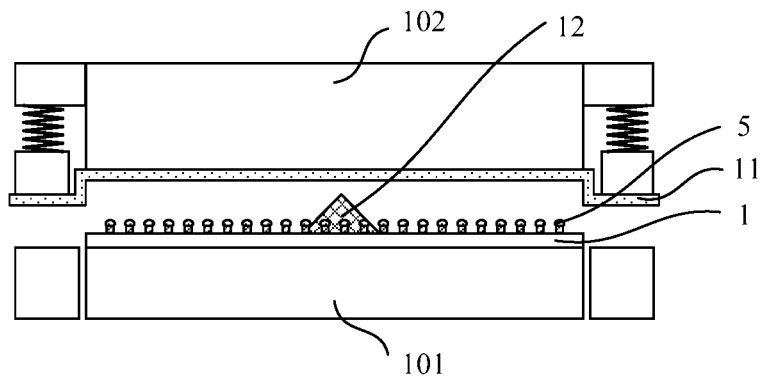
FIG. 7 illustrates a schematic view of an isolating film sticking to a lower surface of a top pressing block of the press molding assembly, the substrate placed on a surface of the bottom pressing block according to the present disclosure.

As illustrated in FIG. 7, when S4-2 is perform: an isolating film 11 is deposited to a bottom surface of the top pressing block 102, the substrate 1 is placed on the top surface of the bottom pressing block 101 and a plastic encapsulation material 12 is placed on the surface of the redistribution layer 3. The plastic encapsulation material 12 may be in liquid form or as solid particles, wherein the solid particles may be turned into liquid under subsequent high temperature and high pressure.

Figure 8:
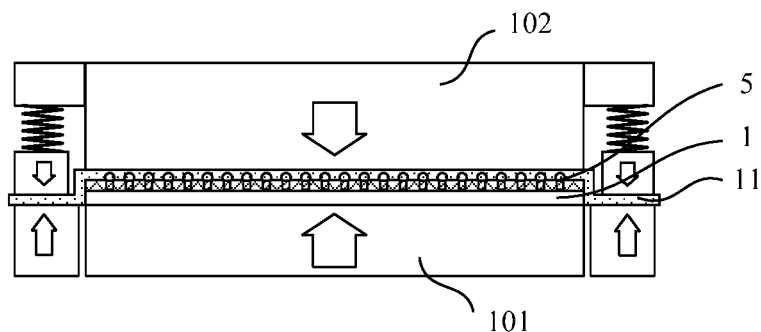
FIG. 8 illustrates a schematic view of clamping the substrate through the top pressing block and the bottom pressing block to flatten the plastic encapsulation material, according to the present disclosure.

As illustrated in FIG. 8, S4-3 is perform: the substrate 1 is clamped between the top pressing block 102 and the bottom pressing block 101 which flattens the plastic encapsulation material, and as a result, the upper ends of the first bump structures 5 are pushed up and embedded inside the isolating film 11.

Figure 9:
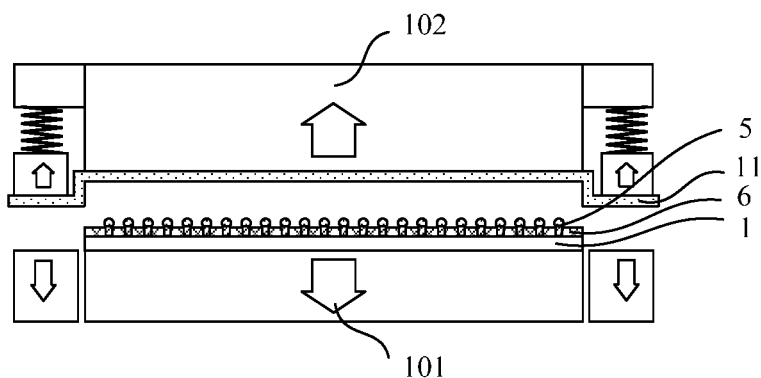
FIG. 9 illustrates a schematic view of releasing the top pressing block and the bottom pressing block, according to the present disclosure.
Figure 10:
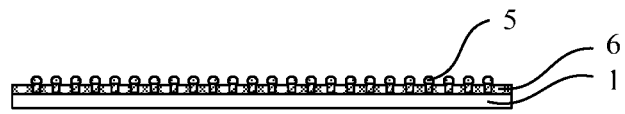
FIG. 10 illustrates a schematic view of a structure obtained after stripping off the isolating film and removing the press molding according to the present disclosure.

As illustrated in FIG. 9, after S4-4 is perform: the top pressing block 102 and the bottom pressing block 101 are released and the isolating film 11 is stripped off (in FIG. 10).

Specifically, the isolating film 11 is a flexible polymer material, including but not limited to polyimide, epoxy resin and polyester (PET) and the like. Through the isolating film 11, during the press molding process, the upper ends of the first bump structures 5 are embedded into the isolating film 11, so that the upper ends of the first bump structures 5 protrude from a surface of the plastic encapsulation material.

As illustrated in FIG. 10 which illustrates a schematic view of a structure obtained after the press molding, the flattened plastic encapsulation material after being solidified is used as the plastic encapsulation layer 6 and the plastic encapsulation layer 6 exposes the upper ends of the first bump structures 5. It needs to be stated that, in order to facilitate illustrations, the adhesive layer 2, the redistribution layer 3 and the first chip 4 on the substrate 1 are not illustrated in FIGS. 7, 8, 9 and 10 in detail.

In the present invention, the plastic encapsulation layer is obtained by the press molding process in combination with the isolating film, so that the upper surface of the plastic encapsulation layer is lower than the top portions of the first bump structures, which avoids a thinning process and a laser drilling process of the plastic encapsulation layer, the benefits of this process include materials saving, and pollution reduction, meanwhile avoiding damages to circuit structures due to the thinning process.

Figure 11:
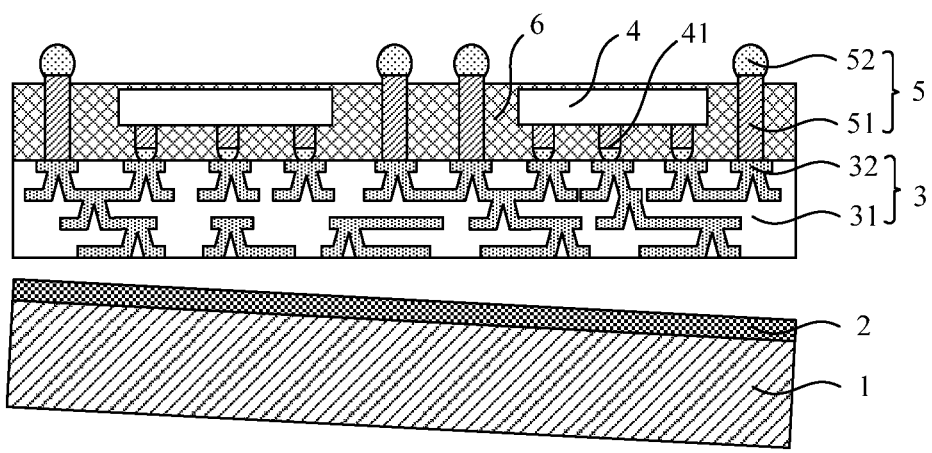
FIG. 11 illustrates a schematic cross sectional view of the fan-out package structure after removing the substrate and the adhesive layer according to the present disclosure.
Figure 12:
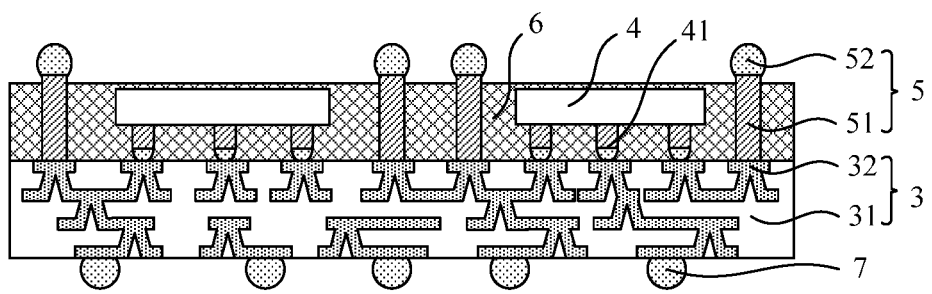
FIG. 12 illustrates a schematic cross sectional view of the fan-out package structure after a second bump structure is fabricated on a bottom surface of the redistribution layer according to the present disclosure.

Finally referring to FIG. 11 and FIG. 12, as step S5 is perform: the substrate 1 and the adhesive layer 1 are removed, and a second bump structure 7 is fabricated on the bottom surface of the redistribution layer 3.

Specifically, the second bump structure 7 may be a metal solder ball.

At this point, the fan-out package structure of the present disclosure has been completed, wherein the first bump structures 5 are embedded into the plastic encapsulation layer 6 with the upper ends exposed. The plastic encapsulation layer 6 not only plays a role of plastic-packaging for the first chip 5 with exposed top, but it also combines with the first bump structures to substitute a TSV structure, therefore enables a package-on-package structure.

Figure 13:
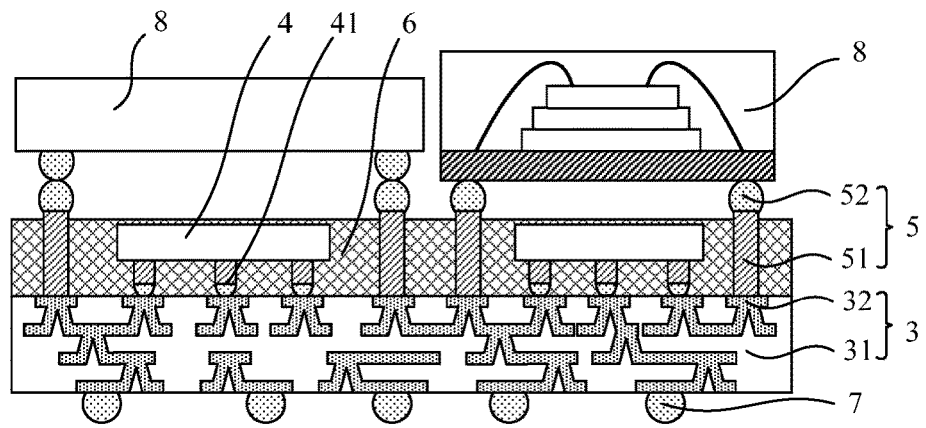
FIG. 13 illustrates a schematic cross sectional view of the fan-out package structure bonding at least one first package to exposed upper ends of the first bump structures according to the present disclosure.

FIG. 13 illustrates a schematic cross sectional view of the fan-out package structure in which bonding at least one first package 8 to the exposed upper ends of the first bump structures 5, wherein the plurality of first packages may be of the same type or of different types to satisfy various application demands.

As compared to the complex TSV fabrication process, the present disclosure of the fan-out packing technique is simpler, by first fabricating the first bump structures, before forming the plastic encapsulation layer with the press molding, in this process flow the upper package can be directly bonded to the exposed upper ends of the first bump structures, thereby the later packaging process is also simpler and the cost is reduced.

Figure 14:
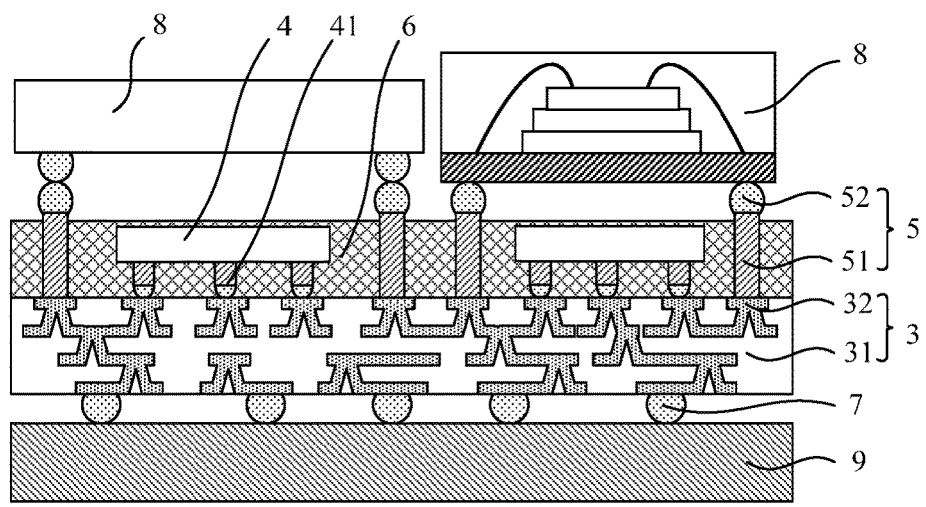
FIG. 14 illustrates a schematic cross sectional view of the fan-out package structure after connecting to a second package through the second bump structures, according to the present disclosure.

Besides, as illustrated in FIG. 13 and in FIG. 14, the package of FIG. 13 may be further connected to the second device 9 through the second bump structures 7. As an example, the second device 9 may be a PCB. In other embodiments, the second device 9 may also be other products. Therefore, the protection scope of the present application shall not be excessively limited herein.

Embodiment 2

FIG. 12 illustrates a schematic cross sectional view of another fan-out package structure after a second bump structure is fabricated on a bottom surface of the redistribution layer according to the present disclosure.

This fan-out package structure comprises:
a redistribution layer 3;
at least one first chip 4 bonded to an upper surface of the redistribution layer 3 and electrically connected with the redistribution layer 3;
at least two bump structures 5 electrically connected with the redistribution layer 3 and having top portions higher than a top portion of the first chip 4;
a plastic encapsulation layer 6 covering the first chip 4 and exposing upper ends of the first bump structures 5; and
a second bump structure 7 fabricated on a lower surface of the redistribution layer 3.

Specifically, the redistribution layer 3 comprises a dielectric layer 31 and at least one layer of redistribution metal line 32 formed in the dielectric layer 31. As an example, the redistribution layer 3 comprises four layers of redistribution metal lines 32, wherein the redistribution metal lines 32 in a top layer and a bottom layer are respectively exposed at an upper surface and a lower surface of the dielectric layer 31. All layers of redistribution metal lines 32 are connected through a plurality of conducting posts.

The redistribution metal lines 32 adopt a conductive metal formed of but not limited to a good conductor such as copper, aluminum and titanium. The material of the dielectric layer 31 includes but not limited to epoxy resin, silicone rubber, silicon resin, PI, PBO, and BCB, and may also be low-K dielectrics such as silicon oxide, phosphorosilicate glass and fluoride glass and the like.

Specifically, one end of a third bump structure 41 is fabricated on a surface of the first chip 4, and the other end is electrically connected with the redistribution layer 3. The third bump structure 41 is made of materials including but not limited to a copper, nickel or silver-tin-copper alloy solder ball. The first chip 4 may include a substrate or more circuit structures. When a number of first chips 4 are bonded to the upper surface of the redistribution layer 3, the first chips 4 may be of the same type and may also be of various types.

Specifically, the top portions of the first bump structures 5 are made higher than the top portion of the first chip 4. When there are a number of first chips 4 with different heights, the top portions of the first bump structures 5 are always made higher than the top portions of all first chips 4.

In this embodiment, each of the first bump structures 5 comprises a metal post 51 and a tin-based metal cap 52 formed at the top end of the metal post 51. The metal post 51 includes but not limited to a Cu post or a Ni post.

In another embodiment, the first bump structures 5 may be formed of only metal solder balls without metal posts. The metal solder balls solution for first bump structures 5 compared to combining metal posts with tin-based metal caps is more beneficial for saving packaging area.

Specifically, the plastic encapsulation layer 6 adopts a thermosetting material, including but not limited to one or more of a polymer material, a resin-based material, polyimide (PI) and epoxy resin. The heights of the exposed upper ends of the first bump structures 5 over the plastic encapsulation layer 6 may be adjusted as needed.

The fan-out package structure of the present disclosure not only enables a package-on-package structure, also provides a multiple package bonding capability. As illustrated in FIG. 13, the fan-out package structure further comprises at least one first package 8 bonded to the exposed upper ends of the first bump structures 5, wherein a plurality of the first packages may be of the same type or various types, so as to satisfy multiple application demands.

Besides, as illustrated in FIG. 14, the fan-out package structure may further comprise a second package 9 connected with the second bump structure 7. The second package 9 is able to bond to a PCB or other packages.

In the fan-out package structure of the present invention, the plastic encapsulation layer 6 not only plays a role of plastic packaging the first chip 4, but also combines with the first bump structures 5 to substitute a TSV structure, therefore enables a package-on-package structure. As compared to the complex TSV fabrication process, the TSV-like structure consisting of the plastic encapsulation layer 6 and the first bump structures 5 in the present disclosure is more easily fabricated, which helps to simplify the process flow and reduce the cost. Since the first bump structures 5 are embedded in the plastic encapsulation 6 with the upper ends thereof being exposed, package-on-package is more easily realized. The package on package structure may be further bonded to a PCB or other packages through the second bump structure 7, which helps to improve the packaging efficiency.

To sum up, the fan-out package structure and the manufacturing method thereof provided by the present application have the following benefits: (1) in the manufacturing method of the fan-out package structure the redistribution layer is fabricated on the carrier before the chip is connected with the redistribution layer, the method avoids the problem of misalignment between the chip and the redistribution layer from the shrinkage of the plastic encapsulation material during heating or solidification in the traditional plastic encapsulation process, and the yield is greatly improved.

(2) The present disclosure may enable bonding at least one first package to the exposed upper ends of the first bump structures, to obtain a package-on-package structure; the plurality of first packages may be of various types, widening application varieties. (3) The present disclosure allows the first bump structures to be interconnection structures of the package-on-package, wherein the first bump structures are embedded into the plastic encapsulation layer and the upper ends of the first bump structures are exposed; as compared to the complex TSV fabrication process, the present disclosure fabricates the first bump structures, before forming the plastic encapsulation layer with the press molding, so the process flow is simpler, and the upper package can be directly bonded to the exposed upper ends of the first bump structures, thereby the packaging procedure is simpler and the cost is reduced. (4) The present disclosure forms the plastic encapsulation layer by a press molding process in combination with an isolating film, so that the upper surface of the plastic encapsulation layer is lower than the top portions of the first bump structures. This technique avoids a plastic thinning process and a laser drilling process of the plastic encapsulation layer, resulting in saving materials and decreasing pollution and facilitates the manufacture of the package-on-package. (5) the fan-out package structure disclosed by the present application not only enables a package-on-package structure, also provides a multiple package bonding capability for multiple application demands. Simultaneously the resultant final package-on-package structure is able to bond to a PCB or other packages through the second bump structures. Therefore, the present disclosure effectively overcomes various disadvantages in the prior arts and thus has a great industrial utilization value.

The above-mentioned embodiments are just used for exemplarily describing the principle and effects of the present application, instead of limiting the present disclosure. One skilled in the art may make modifications or changes to the above-mentioned embodiments without departing from the spirit and the scope of the present application. Therefore, all equivalent modifications or changes made by one skilled having common knowledge in the art without departing from the spirit and technical concept disclosed by the present invention shall be covered by the claims of the present application.

What is claimed is:

1. A manufacturing method of a fan-out package structure for integrated circuits, comprising the following steps:
    S1: providing a substrate and forming an adhesive layer on an upper surface of the substrate;
    S2: forming a redistribution layer on an upper surface of the adhesive layer;
    S3: bonding at least one first chip to an upper surface of the redistribution layer and fabricating at least two first bump structures, wherein the first chip and the first bump structures are all electrically connected with the redistribution layer, and wherein top portions of the first bump structures are higher than a top portion of the first chip;
    S4: forming a plastic encapsulation layer on the upper surface of the redistribution layer, wherein the plastic encapsulation layer covers the first chip and exposes upper ends of the first bump structures; and
    S5: removing the substrate and the adhesive layer to expose a bottom surface of the redistribution layer, and fabricating a second bump structure on the bottom surface of the redistribution layer.

2. The manufacturing method of the fan-out package structure according to claim 1, wherein, the method further comprises a step S6: bonding at least a first package to the exposed upper ends of the first bump structures.

3. The manufacturing method of the fan-out package structure according to claim 2, wherein, a resultant structure after bonding the first package in the step S6 is connected to a second package through the second bump structure.

4. The manufacturing method of the fan-out package structure according to claim 1, wherein, the redistribution layer comprises a dielectric layer and at least one layer of redistribution metal line formed in the dielectric layer.

5. The manufacturing method of the fan-out package structure according to claim 1, wherein, in the step S3, a third bump structure is fabricated on a surface of the first chip, wherein the first chip is electrically connected with the redistribution layer through the third bump structure.

6. The manufacturing method of the fan-out package structure according to claim 1, wherein, in the step S3, each of the at least two first bump structures comprises a metal post and a tin-based metal cap formed at a top end of the metal post.

7. The manufacturing method of the fan-out package structure according to claim 6, wherein, the metal post is a Cu post or a Ni post.

8. The manufacturing method of the fan-out package structure according to claim 1, wherein, in the step S3, the first bump structures are metal solder balls.

9. The manufacturing method of the fan-out package structure according to claim 1, wherein, in the step S4, a press molding process is adopted for forming the plastic encapsulation layer and comprises the following steps:
    S4-1: providing a press molding assembly comprising a bottom pressing block and a top pressing block;
    S4-2: sticking an isolating film to a bottom surface of the top pressing block, placing the substrate on a top surface of the bottom pressing block, and placing a plastic encapsulation material on a surface of the redistribution layer;
    S4-3: clamping the substrate between the top pressing block and the bottom pressing block to flatten the plastic encapsulation material, and embedding the upper ends of the first bump structures into the isolating film; and
    S4-4: releasing the top pressing block and the bottom pressing block, and stripping off the isolating film.

10. The manufacturing method of the fan-out package structure according to claim 9, wherein, the isolating film is form of a flexible polymer material.

11. The manufacturing method of the fan-out package structure according to claim 1, wherein, in the step S5, the second bump structure is a metal solder ball.

12. A fan-out package structure for integrated circuits, comprising:
    a redistribution layer;
    at least one first chip bonded to an upper surface of the redistribution layer and electrically connected with the redistribution layer;
    at least two bump structures bonded to the upper surface of the redistribution layer and electrically connected with the redistribution layer, wherein top portions of the bump structures are higher than a top portion of the first chip;
    a plastic encapsulation layer covering the first chip and exposing upper ends of the first bump structures; and
    a second bump structure fabricated on a bottom surface of the redistribution layer.

13. The fan-out package structure according to claim 12, wherein, the fan-out package structure further comprises at least one first package bonded to the exposed upper ends of the first bump structures.

14. The fan-out package structure according to claim 12, wherein, the fan-out package structure further comprises a second package connected with the second bump structure.

15. The fan-out package structure according to claim 12, wherein, the redistribution layer comprises a dielectric layer and at least one layer of redistribution metal line formed in the dielectric layer.

16. The fan-out package structure according to claim 12, wherein, a third bump structure is fabricated on a surface of the first chip, and wherein the first chip is electrically connected with the redistribution layer through the third bump structure.

17. The fan-out package structure according to claim 12, wherein each of the at least two first bump structures comprises a metal post and a tin-based metal cap formed at a top end of the metal post.

\* \* \* \* \*